(12) United States Patent
Rahman et al.

(10) Patent No.: US 8,933,447 B1
(45) Date of Patent: Jan. 13, 2015

(54) METHOD AND APPARATUS FOR PROGRAMMABLE DEVICE TESTING IN STACKED DIE APPLICATIONS

(75) Inventors: Arifur Rahman, San Jose, CA (US); Ramakrishna K. Tanikella, Hyderabad (IN); Trevor J. Bauer, Boulder, CO (US); Brian C. Gaide, Glassboro, NJ (US); Steven P. Young, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 773 days.

(21) Appl. No.: 12/778,962

(22) Filed: May 12, 2010

(51) Int. Cl.
*H01L 23/02* (2006.01)
*H01L 23/34* (2006.01)

(52) U.S. Cl.
USPC .............................................. 257/48; 257/797

(58) Field of Classification Search
CPC ............................................ H01L 2225/06544
USPC ................................................... 257/48, 797
See application file for complete search history.

(56) References Cited

U.S. PATENT DOCUMENTS

| 4,974,048 | A  | * | 11/1990 | Chakravorty et al. | ........ 257/530 |
| 6,933,747 | B1 |   | 8/2005  | Bauer et al.       |                 |
| 7,518,398 | B1 |   | 4/2009  | Rahman et al.      |                 |
| 7,605,458 | B1 |   | 10/2009 | Rahman et al.      |                 |
| 7,619,441 | B1 |   | 11/2009 | Rahman et al.      |                 |
| 2004/0255258 | A1 | * | 12/2004 | Li | ..................................... 716/8 |
| 2008/0246030 | A1 | * | 10/2008 | Satya et al. | ..................... 257/48 |

* cited by examiner

*Primary Examiner* — Matthew W Such
*Assistant Examiner* — Robert Carpenter
(74) *Attorney, Agent, or Firm* — Michael R. Wallace; John J. King; Thomas George (57) ABSTRACT

A method and apparatus to test the inter-die interface between two or more semiconductor die in die stacking applications, where a mismatch exists between the number of input and output pads on a base die and the number of input and output pads on a stacked die. In a first embodiment, a number of through-die vias (TDVs) may be used to implement inter-die signal paths using standard or flexible design rules to maintain statistical TDV yield despite the lack of continuity verification of the inter-die signals paths. In alternate embodiments, programmable multiplexers may be utilized to share one or more inter-die connections between the base die and the one or more stacked die so as to facilitate testing and normal operation of each inter-die connection. In other embodiments, spare TDVs are utilized only during test operations, so as to accommodate the mismatch. In yet other embodiments, built-in-test (BIT) circuits are configured to perform logic operations using a plurality of inter-die input/output (I/O) signals to eliminate the need to implement an identical number of input and output ports between the base die and the one or more stacked die to facilitate inter-die testing.

15 Claims, 6 Drawing Sheets

METHOD AND APPARATUS FOR PROGRAMMABLE DEVICE TESTING IN STACKED DIE APPLICATIONS

FIELD OF THE INVENTION

The present invention generally relates to testing of programmable logic devices (PLDs), and more particularly to testing PLDs that are adapted for use in stacked die applications.

BACKGROUND OF THE INVENTION

System-in-package (SIP) is an integration approach that is often utilized to achieve intelligent partitioning of the key components of an electronics system to achieve increased functionality using smaller form factors. One implementation of SIP technology applies three-dimensional integration, whereby two or more semiconductor die are stacked on top of each other so as to increase the amount of circuitry that may exist per unit area.

Die stacking involves a process whereby a base die, such as a field programmable gate array (FPGA), provides a platform for one or more stacked die, such as random access memory (RAM) or a microprocessor. Interconnections between the base die and the one or more stacked die may be implemented using a plurality of implementations, such as using micro-bumps or wire bonds.

The inter-die connections may be facilitated through the use of programmable heterogeneous integration (PHI), which is disclosed in U.S. patent application Ser. No. 11/973,062, filed on Oct. 4, 2007 by Rahman et al, assigned to the assignee of the present invention and which is incorporated herein by reference in its entirety. In general, a PHI tile consists of programmable multiplexers, through-die vias (TDVs), level translation circuits, test circuits, and dedicated power supply ports. A PHI tile is used to interconnect a base die having specific patterns of TDVs and associated input/output (I/O) pads with one or more stacked die having I/O pads that match the I/O pad placements of the base die. Signals existing within the stacked die may then be propagated to the base die using the associated TDVs, I/O pads, and level translation circuitry as may be required in a particular application.

Figure 1A:
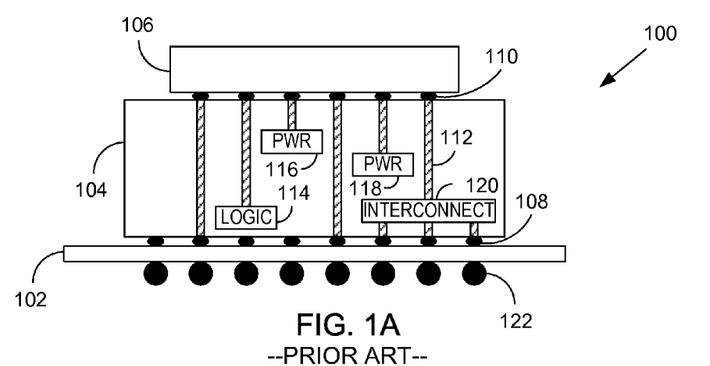
FIG. 1A illustrates an exemplary cross-section of a stacked-die package.

Turning to FIG. 1A, a cross-section of stacked-die package 100 is exemplified, whereby one or more flip-chip packages may be assembled using micro-bump interconnection. In particular, the active side of stacked die 106 contains an array of pads upon which solder bumps 110 are attached. Base die 104 similarly contains a corresponding array of pads, which electrically combine with solder bumps 110 to form the interconnection between stacked die 106 and base die 104.

Base die 104 also contains an array of pads upon which solder bumps 108 are attached. Package substrate 102 similarly contains a corresponding array of pads, which electrically combine with solder bumps 108 to form the interconnection between base die 104 and package substrate 102. Package substrate 102 also provides the required interconnect structure so as to interconnect solder bumps 108 with ball grid array 122 of stacked-die package 100. Ball grid array 122 is then used to interconnect stacked-die package 100 to a circuit board (not shown) in order to facilitate signal exchange between stacked die 106, base die 104, package substrate 102 and the signal trace layers (not shown) of the circuit board.

Various test procedures exist, whereby the functionality of stacked-die package 100 may be verified. However, the functionality of TDVs 112 must also be verified, so as to test the continuity of connections formed between stacked die 106 and interconnect 120, logic 114, and power supply layers 116, 118 via TDVs 112 of base die 104. In particular, scan chains, or loop backs, may be instantiated using the programmable multiplexers of the PHI tiles that may be used to interconnect base die 104 with stacked die 106. In such an instance, a scan chain may be created, whereby a continuity signal is sequentially exchanged between each I/O connection of base die 104 and the corresponding I/O connection of stacked die 106 until the continuity of all I/O connections is verified.

Figure 1B:
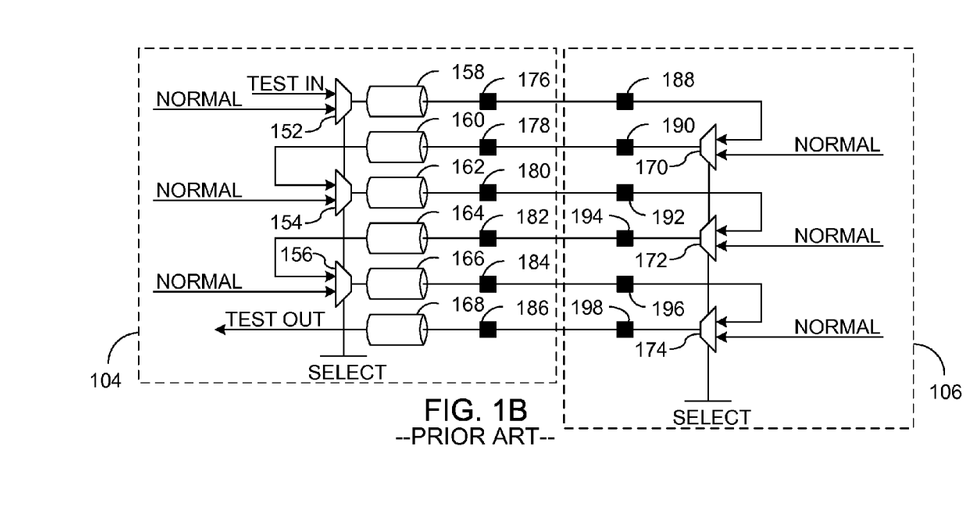
FIG. 1B illustrates an exemplary stacked die interface.

Scan chain testing is an effective method to verify the interconnections between two or more stacked die, so long as a one-to-one correspondence exists between each input connection of the base die and the corresponding output connection of the stacked die under test and/or between each output connection of the base die and the corresponding input connection of the stacked die under test. Turning to FIG. 1B, an exemplary inter-die interface is illustrated, in which the number of input pads of stacked die 106, e.g., pads 188, 192, and 196, is equal to the number of output pads of base die 104, e.g., 176, 180, and 184, and the number of output pads of stacked die 106, e.g., 190, 194, and 198, is equal to the number of input pads of base die 104, e.g., 178, 182, and 186.

During scan chain testing of the inter-die interface of FIG. 1B, signal SELECT is asserted such that multiplexers 152-156 and 170-174 of their respective PHI tiles select their respective first input terminals as the active input terminal. As such, signal TEST IN is applied to the first input terminal of multiplexer 152 of base die 104 and propagates throughout the interconnect structure between base die 104 and stacked die 106 via TDV 158, output pad 176, input pad 188, multiplexer 170, output pad 190, input pad 178, and so on, until signal TEST IN emerges from TDV 168 as signal TEST OUT. In such an instance, the continuity of the entire interconnect structure between base die 104 and stacked die 106 is verified. If signal TEST OUT does not emerge from TDV 168, on the other hand, the continuity test of the interconnect structure between base die 104 and stacked die 106 is deemed a failure. In such an instance, the length of the scan chain may be reduced in order to isolate the failure.

Under normal operating conditions, signal SELECT is deasserted such that multiplexers 152-156 and 170-174 of their respective PHI tiles select their respective second input terminals as the active input terminal. In such an instance, the signals, e.g., NORMAL, are allowed to propagate through the interconnect structure between base die 104 and stacked die 106 as required to implement their respective functions during normal operating conditions.

Should a mismatch exist, however, between the number of input connections of the base die and the number of output connections of the base die and/or the number of output connections of the stacked die and the number of input connections of the stacked die, then a scan chain test fails to function as designed. In particular, certain of the interconnects between the base die and the stacked die are left unverified due to the interconnect mismatch.

Efforts continue, therefore, to provide greater flexibility of inter-die connections, so as to facilitate complete continuity testing between two or more stacked die having mismatched I/O connections.

SUMMARY OF THE INVENTION

To overcome limitations in the prior art, and to overcome other limitations that will become apparent upon reading and understanding the present specification, various embodiments of the present invention disclose a method and apparatus for enhanced interface testing of two or more stacked die.

In accordance with one embodiment of the invention, a stacked-die package comprises a base die having first and second pluralities of through-die vias that are coupled to a first plurality of input and output pads on a first surface of the base die. The stacked-die package further comprises a first stacked die having a second plurality of input and output pads on a first surface of the first stacked die, a portion of the first plurality of input and output pads being coupled to a portion of the second plurality of input and output pads and adapted to transfer signals between the base die and the first stacked die during normal operation of the stacked-die package. The stacked-die package further comprises a mechanism incorporated within the stacked-die package to substantially confirm complete conductivity between the base die and the first stacked die despite a mismatch between a number of the first plurality of input and output pads and a number of the second plurality of input and output pads.

In accordance with another embodiment of the invention, a method of substantially confirming the conductivity of a mismatched inter-die interface of a stacked-die package comprises configuring first and second pluralities of through-die vias within a base die, coupling the first and second pluralities of through-die vias to a corresponding first plurality of input and output pads within the base die, coupling a first portion of a second plurality of input and output pads within a stacked die to a first portion of the first plurality of input and output pads within the base die, and confirming a substantially complete conductivity between the base die and the stacked die despite a mismatch in a number of the first plurality of input and output pads and a number of the second plurality of input and output pads.

In accordance with another embodiment of the invention, a stacked-die package comprises a base die that includes a plurality of through-die vias and a first plurality of interconnect pads that are coupled to the plurality of through-die vias. The stacked-die package further comprises a stacked die that is coupled to the base die to form an inter-die interface between the stacked die and the base die. The stacked die includes a second plurality of interconnect pads and a first logic block that is coupled to the second plurality of interconnect pads. The first logic block is adapted to exchange test signals with the base die to verify continuity of the plurality of through-die vias and the first and second pluralities of interconnect pads.

BRIEF DESCRIPTION OF THE DRAWINGS

Various aspects and advantages of the invention will become apparent upon review of the following detailed description and upon reference to the drawings in which.

DETAILED DESCRIPTION

Generally, various embodiments of the present invention are applied to the field of integrated circuits (ICs) of which programmable logic devices (PLDs) are a subset. In particular, a method and apparatus is provided to test the inter-die interface between two or more semiconductor die (hereinafter referred to as "die") in die stacking applications. In a first embodiment, a number of through-die vias (TDVs), or redundant TDVs, are implemented using flexible design rules, e.g., increased TDV diameter and increased TDV spacing, to increase TDV yield. Since flexible design rules are used to implement the redundant TDVs, a presumption exists that the redundant TDV yield is high enough to obviate the need to test the redundant TDVs. The redundant TDVs may then be utilized during normal operations as required, such that the redundant TDVs may be utilized to balance the mismatch of interconnections between the base die and the one or more stacked die.

In alternate embodiments, redundant TDVs may instead be implemented using standard design rules, whereby the number of redundant TDVs implemented is increased. In such an instance, the statistical yield is increased due to the redundancy established by the increased number of redundant TDVs. A presumption exists, therefore, that the redundant TDV yield is high enough such that testing of the redundant TDVs may be precluded. The redundant TDVs may then be utilized during normal operations as required, such that the redundant TDVs may be utilized to balance the mismatch of interconnections between the base die and the one or more stacked die.

In one embodiment, one or more programmable multiplexers are utilized to share one or more inter-die connections between the base die and the one or more stacked die. In such an instance, multiple test vectors may be submitted to the stacked-die package, so as to exercise all of the conduction paths of the interconnect between the base die and one or more stacked die using the programmable multiplexers of, e.g., the programmable heterogeneous integration (PHI) tile. In other embodiments, spare TDVs are utilized only during test operations, so as to obviate the need for multiple test vectors. In yet other embodiments, built-in-test (BIT) circuits are configured to perform logic operations using a plurality of inter-die input/output (I/O) signals to eliminate the need to implement an identical number of input and output ports between the base die and the one or more stacked die for scan chain testing.

While the embodiments described herein generally describe inter-die interface testing using TDVs and corresponding micro-bumps to create the inter-die connections, testing of inter-die connections using other stacked die interfaces may also benefit. In some die-stacking applications, for example, wire bonds are used to create the inter-die connections, which are equally applicable to the plurality of interface apparatus and test method embodiments provided herein.

Figure 2A:
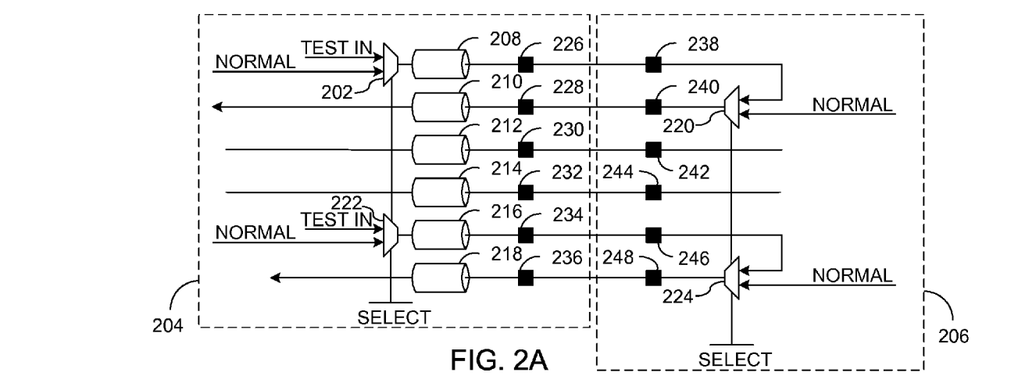
FIG. 2A illustrates an exemplary stacked die interface exhibiting redundant through-die-vias implemented using standard design rules.

Turning to FIG. 2A, a stacked-die interface is illustrated, wherein redundant TDVs and their respective inter-die connections are implemented within a die to increase the statistical yield of those inter-die connections with little or no test coverage. That is to say, in other words, that due to a mismatch between the number of output connections of base die 204 and the number of input connections of stacked die 206 and/or the number of input connections of base die 204 and the number of output connections of base die 204, a portion of the inter-die connections between base die 204 and stacked die 206 may not form a part of a scan-chain loop and, therefore, may not be adequately tested, if at all.

In such an instance, an acceptable statistical yield may nevertheless be maintained for the extra, untested inter-die connection by retaining redundant inter-die signal paths as "back-up" inter-die connections that are to be used as necessary in case of a failure. The redundant inter-die signal paths, therefore, form mechanisms within the stacked-die package that substantially confirm complete conductivity between the base die and the stacked die despite the inter-connectivity mismatch.

FIG. 2A represents one embodiment of the present invention, whereby standard design rules may be used to implement inter-die connection redundancy. TDVs 208-210 exist within base die 204 to facilitate the inter-die signal path that includes output pad 226/input pad 238 and output pad 240/input pad 228. Similarly, TDVs 216-218 exist within base die 204 to facilitate the inter-die signal path that includes output pad 234/input pad 246 and output pad 248/input pad 236. Other pairs of inter-die signal paths (not shown) may also exist between base die 204 and stacked die 206. It can be seen, therefore, that for each pair of inter-die signal paths that exist between base die 204 and stacked die 206, a scan-chain loop may be formed to verify their continuity.

Additional inter-die signal paths may, however, exist between base die 204 and stacked die 206 that cannot be included within a scan-chain loop during a scan-chain test for a number of different reasons. For example, base die 204 may provide, e.g., 101 outputs and 100 inputs, while stacked die 206 may provide, e.g., 101 inputs and 100 outputs. Scan-chain testing may then be used to verify the inter-die signal paths associated with 100 base die 204 outputs and the corresponding 100 stacked die inputs. A single inter-die signal path that includes, e.g., TDV 212 and pads 230/242, however, remains untested, In such an instance, a redundant inter-die signal path that includes, e.g., TDV 214 and pads 232/244, may be implemented as a "back-up" inter-die signal path that may be utilized in the event that the inter-die signal path that includes, e.g., TDV 212 and pads 230/242, fails during normal operation.

During scan-chain testing of the inter-die interface of FIG. 2A, signal SELECT is asserted such that multiplexers 202, 222 and 220, 224 select their respective first input terminals as the active input terminal. As such, signal TEST IN may be applied to the first input terminal of multiplexer 202 of base die 204 and propagated throughout a portion of the interconnect structure between base die 204 and stacked die 206 via, e.g., TDV 208, output pad 226, input pad 238, multiplexer 220, output pad 240, input pad 228, and TDV 210, until signal TEST IN emerges from TDV 210. Similarly, signal TEST IN may also be applied to the first input terminal of multiplexer 222 of base die 204 and propagated throughout a portion of the interconnect structure between base die 204 and stacked die 206 via, e.g., TDV 216, output pad 234, input pad 246, multiplexer 224, output pad 248, input pad 236, and TDV 218, until signal TEST IN emerges from TDV 218.

The continuity of the inter-die signal paths that include, e.g., TDVs 212-214, pads 230-232, and pads 242-244, however, is not verified during scan chain testing. Instead, by providing redundant inter-die signal paths, a statistical probability exists that at least one of the inter-die signal paths can provide the inter-die connection as required by a particular application. It is understood that while only a pair of redundant inter-die signal paths are illustrated, any number of redundant inter-die signal paths may be implemented depending upon the requirements of the application.

Under normal operating conditions, signal SELECT is deasserted such that multiplexers 202, 222 and 220, 224 select their respective second input terminals as the active input terminal. In such an instance, signals, e.g., NORMAL, are allowed to propagate through the interconnect structure between base die 204 and stacked die 206 as required to implement their respective functions during normal operating conditions. In addition, at least one of the inter-die signal paths that include, e.g., TDVs 212-214, pads 230-232, and pads 242-244, may be utilized to fulfill the remaining inter-die connection(s) that is required between base die 204 and stacked die 206.

Figure 2B:
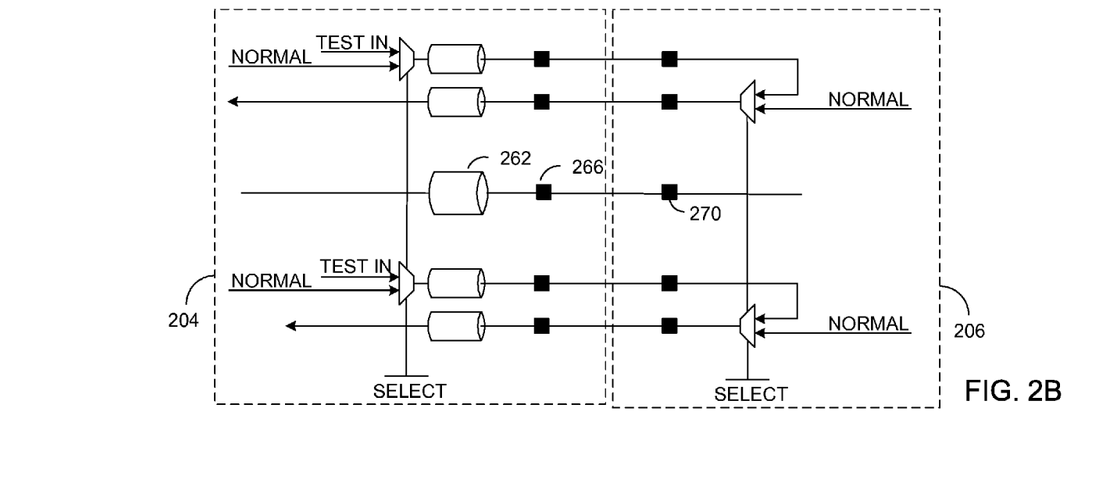
FIG. 2B illustrates a stacked die interface exhibiting redundant through-die-vias implemented using flexible design rules, in accordance with an embodiment of the present invention.

FIG. 2B illustrates an alternate embodiment of the present invention that increases the statistical yield of any inter-die connections that exhibit little or no test coverage. In particular, flexible design rules are used to implement the inter-die signal path that includes, e.g., TDV 262 and pads 266/270, whereby TDV 262 exists within base die 204 to facilitate the interconnect between interconnect pads 266 and 270. Implementation of TDV 262 utilizes flexible design rules, such as increased TDV diameter and increased TDV spacing, to increase the statistical yield of TDV 262. In one embodiment, a 10% increase, for example, in both the TDV diameter and TDV spacing may be used to increase the statistical yield of TDV 262.

As discussed above in relation to FIG. 2A, however, an inter-die connection, such as the inter-die connection that includes, e.g., TDV 262 and pads 266/270, may exist between base die 204 and stacked die 206 that cannot be included within a scan-chain loop during test. In such an instance, by providing flexible design rule TDV 262, a statistical probability exists that TDV 262 will nevertheless provide adequate continuity to facilitate the inter-die connection between base die 204 and stacked die 206 despite the fact that the inter-die connection was not tested. It is understood that while only a single flexible design rule TDV is illustrated, any number of flexible design rule TDVs may be implemented depending upon the requirements of the application. The flexible design rule TDVs, therefore, form mechanisms within the stacked-die package to substantially confirm complete conductivity between the base die and the stacked die despite the inter-connectivity mismatch.

Figure 3:
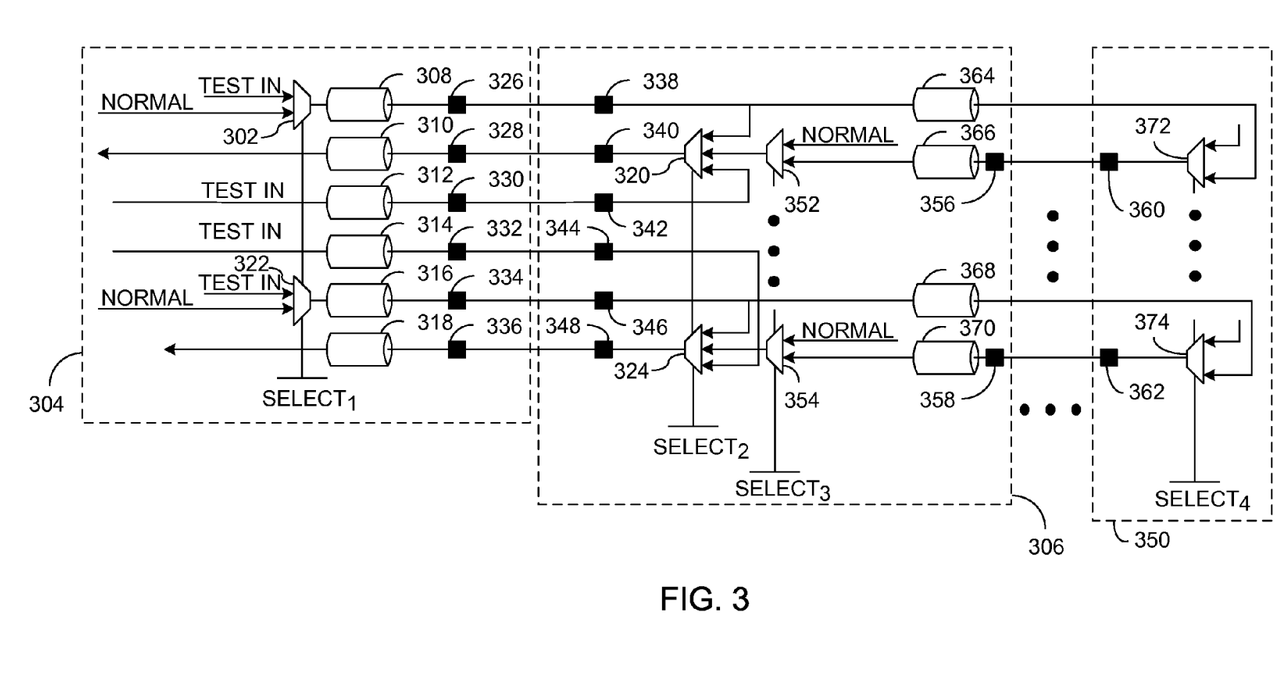
FIG. 3 illustrates an alternate embodiment of a stacked die interface having a base die and two or more stacked die, in accordance with an embodiment of the present invention.

Turning to FIG. 3, an alternate embodiment is exemplified, whereby programmable multiplexers are utilized to create alternate loop back paths during inter-die signal path testing so as to accommodate any I/O mismatches that may exist between base die 304 and stacked die 306, 350. In particular, programmable multiplexers 320, 324 and 352, 354 are used to provide the requisite connectivity, so that the continuity of each inter-die connection may be verified between base die 304 and stacked die 306, 350 despite a mismatch that may exist between the number of output pads existing on base die 304 and the corresponding number of input pads existing on base die 304. The programmable multiplexers, therefore, form mechanisms within the stacked-die package to substantially confirm complete conductivity between the base die and the stacked die despite the inter-connectivity mismatch on base die 304.

As discussed above in relation to FIG. 2A, for example, the inter-die signal path including, e.g., TDV 312 and pads 330/342, may represent an inter-die connection that cannot be included within a scan-chain loop during scan-chain testing. Rather than leave the inter-die signal path untested, multiplexer 320 is instead utilized to form a loop-back signal path that includes, e.g., TDVs 310-312, pads 328-330, and pads 340-342, so as to facilitate testing of an otherwise untestable inter-die connection. Similarly, the inter-die signal path including, e.g., TDV 314 and pads 332/344, may represent an inter-die connection that cannot be included within a scan-chain loop during scan-chain testing. Rather than leave the inter-die signal path untested, multiplexer 324 is instead utilized to form a loop-back signal path that includes, e.g., TDVs 314/318, pads 332/336, and pads 344/348, so as to facilitate testing of an otherwise untestable inter-die connection. It is understood, that a plurality of stacked die may exist between stacked die 306 and 350, where testing of the inter-die connections between the plurality of stacked die and base die 304 may be similarly facilitated.

During a first iteration of scan chain testing of the inter-die connections between base die 304 and stacked die 306, for example, signal $SELECT_1$ is asserted such that multiplexers 302,322 select their respective first input terminals as the active input terminal. Similarly, signal $SELECT_2$ is programmed such that multiplexers 320,324 select their respective first input terminals as the active input terminal. As such, signal TEST IN may be applied to the first input terminal of multiplexer 302 of base die 304 and propagated throughout a portion of the interconnect structure between base die 304 and stacked die 306 via, e.g., TDV 308, output pad 326, input pad 338, multiplexer 320, output pad 340, input pad 328, and TDV 310, until signal TEST IN emerges from TDV 310. Similarly, signal TEST IN may also be applied to the first input terminal of multiplexer 322 of base die 304 and propagated throughout a portion of the interconnect structure between base die 304 and stacked die 306 via, e.g., TDV 316, output pad 334, input pad 346, multiplexer 324, output pad 348, input pad 336, and TDV 318, until signal TEST IN emerges from TDV 318.

During a second iteration of scan chain testing, the remaining inter-die connections between base die 304 and stacked die 306 left untested after the first iteration may be verified through use of, e.g., multiplexers 320 and 324. In particular, signal $SELECT_2$ is programmed such that multiplexers 320, 324 select their respective third input terminals as the active input terminal. As such, signal TEST IN may be applied to the input of TDV 312 of base die 304 and propagated throughout a portion of the interconnect structure between base die 304 and stacked die 306 via, e.g., TDV 312, output pad 330, input pad 342, multiplexer 320, output pad 340, input pad 328, and TDV 310, until signal TEST IN emerges from TDV 310. Similarly, signal TEST IN may be applied to the input of TDV 314 of base die 304 and propagated throughout a portion of the interconnect structure between base die 304 and stacked die 306 via, e.g., TDV 314, output pad 332, input pad 344, multiplexer 324, output pad 348, input pad 336, and TDV 318, until signal TEST IN emerges from TDV 318.

During a third iteration of scan chain testing, the inter-die interfaces between base die 304, stacked die 306, and other stacked die 350 may also be verified. In particular, signal $SELECT_2$ is programmed such that multiplexers 320,324 select their respective second input terminals as the active input terminal, while signals $SELECT_3$ and $SELECT_4$ are programmed such that multiplexers 352,354 and 372,374 select their respective second input terminals as the active input terminal. As such, signal TEST IN may be applied to the first input terminal of multiplexer 302 of base die 304 and propagated throughout a portion of the interconnect structure between base die 304, stacked die 306, and stacked die 350 via, e.g., TDV 308, output pad 326, input pad 338, TDV 364, multiplexer 372, output pad 360, input pad 356, TDV 366, multiplexer 352, multiplexer 320, output pad 340, input pad 328, and TDV 310, until signal TEST IN emerges from TDV 310. Similarly, signal TEST IN may be applied to the first input terminal of multiplexer 322 of base die 304 and propagated throughout a portion of the interconnect structure between base die 304, stacked die 306, and stacked die 350 via, e.g., TDV 316, output pad 334, input pad 346, TDV 368, multiplexer 374, output pad 362, input pad 358, TDV 370, multiplexer 354, multiplexer 324, output pad 348, input pad 336, and TDV 318, until signal TEST IN emerges from TDV 318.

Under normal operating conditions, signal $SELECT_1$ is deasserted such that multiplexers 302,322 select their respective second input terminals as the active input terminal. In addition, signal $SELECT_2$ is programmed such that multiplexers 320,324 select their respective second input terminals as the active input terminal. Further, signals $SELECT_3$ and $SELECT_4$ are deasserted such that multiplexers 352,354 and 372,374 select their respective first input terminals as the active input terminal. In such an instance, signals, e.g., NORMAL, are allowed to propagate through the interconnect structure between base die 204, stacked die 206, and stacked die 350 as required to implement their respective functions during normal operating conditions.

Figure 4:
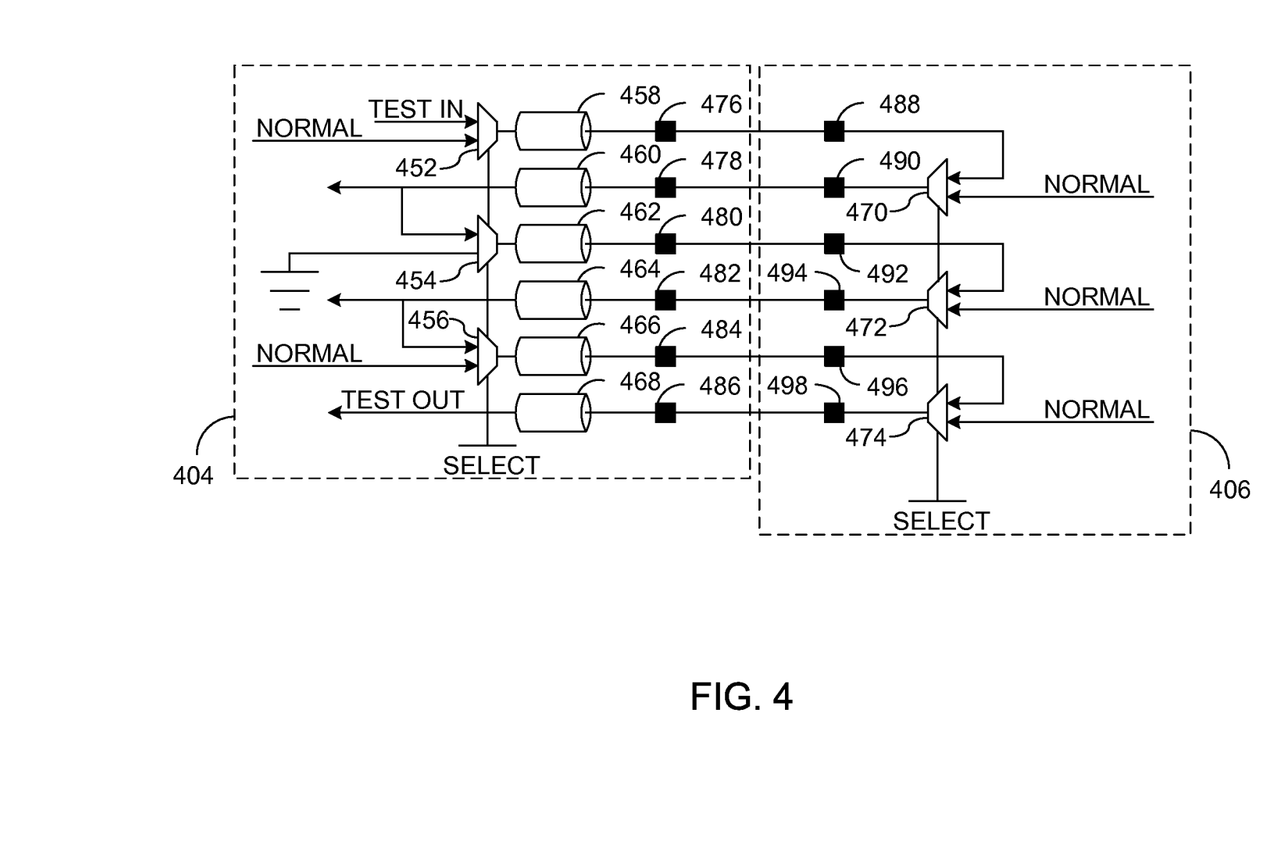
FIG. 4 illustrates an alternate embodiment of a stacked die interface having a spare interconnect for test purposes only, in accordance with an embodiment of the present invention.

Turning to FIG. 4, an alternate embodiment is exemplified, in which a spare inter-die signal path may be utilized only for test purposes in order to accommodate the interface mismatch between the base die and one or more stacked die. In addition, a programmable multiplexer may be utilized to activate the spare inter-die signal path during test operations. In particular, TDV 462 and pad 480 exist, for example, within base die 404 to facilitate the interconnect mismatch between base die 404 and stacked die 406. That is to say, for example, that base die 404 is originally configured with a number of output pads, e.g., output pads 476 and 484, and a number of input pads, e.g., 478, 482, and 486, while stacked die 406 is configured with a number of output pads, e.g., 490, 494, and 498, and a number of input pads, e.g., 488, 492, and 496. Thus, spare TDV 462 and associated output pad 480 are configured within base die 404 so as to accommodate the corresponding input pad, e.g., pad 492, that is associated with stacked die 406. The spare TDV, associated interconnect pad(s), and programmable multiplexer(s), therefore, form mechanisms within the stacked-die package to substantially confirm complete conductivity between the base die and the stacked die despite the inter-connectivity mismatch.

During scan chain testing of the inter-die connections of FIG. 4, signal SELECT is asserted such that multiplexers 452-456 and 470-474 select their respective first input terminals as the active input terminal. As such, signal TEST IN may be applied to the first input terminal of multiplexer 452 of base die 404 and propagated throughout the interconnect structure between base die 404 and stacked die 406 via, e.g., TDV 458, output pad 476, input pad 488, multiplexer 470, output pad 490, input pad 478, and TDV 460. Signal TEST IN continues to propagate to, e.g., multiplexer 454, spare TDV 462, output pad 480, input pad 492, multiplexer 472, and so on, until signal TEST IN either emerges from TDV 468 as signal TEST OUT during a successful test, or does not emerge from TDV 468 during a failed test.

Under normal operating conditions, signal SELECT is deasserted such that multiplexers 452-456 and 470-474 select their respective second input terminals as the active input terminal. In such an instance, multiplexer 454 applies a reference signal, such as ground potential, to spare TDV 462, where TDV 462 remains inactive during normal operating conditions. Signals, e.g., NORMAL, are allowed to propagate through the interconnect structure between base die 404 and stacked die 406 as required to implement their respective functions during normal operating conditions.

Figure 5:
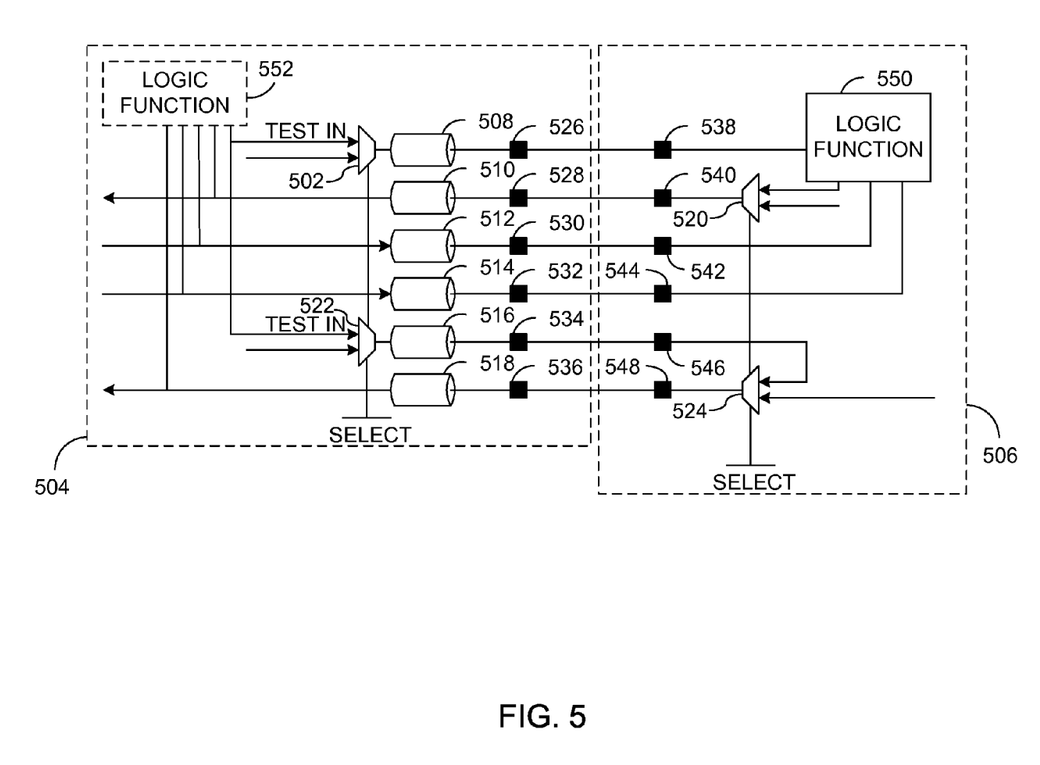
FIG. 5 illustrates an alternate embodiment of a stacked die interface having logic function blocks to execute built-in-tests of the inter-die interface, in accordance with an embodiment of the present invention.

Turning to FIG. 5, an alternate embodiment is exemplified, in which built-in-test (BIT) circuits are configured to perform logic operations using one or more inter-die connections to accommodate an inter-die connection mismatch that may exist between the base die and the one or more stacked die for scan chain testing. In particular, logic function block 550 may be instantiated within stacked die 506 to implement test procedures to verify the continuity of the inter-die signal paths including, e.g., TDVs 508-514 and interconnect pads 526-532 and 538-544.

During scan chain testing of the inter-die interface of FIG. 5, signal SELECT is asserted such that multiplexers 502,522 and 520,524 select their respective first input terminals as the active input terminal. As such, signal TEST IN may be applied to the first input terminal of multiplexer 502 of base die 504, e.g., via optional logic function block 552, and propagated throughout a portion of the interconnect structure between base die 504 and stacked die 506 via, e.g., TDV 508, output pad 526, input pad 538, and logic function block 550. Logic function block 550 may then propagate the signal TEST IN to, e.g., multiplexer 520, output pad 540, input pad 528, and TDV 510, until signal TEST IN emerges from TDV 510. Optional logic function block 552 may then perform signal analysis on the emergent signal from TDV 510 to determine the status of the test. Similarly, signal TEST IN may also be applied to the first input terminal of multiplexer 522 of base die 504, e.g., via optional logic function block 552, and propagated throughout a portion of the interconnect structure between base die 504 and stacked die 506 via, e.g., TDV 516, output pad 534, input pad 546, multiplexer 524, output pad 548, input pad 536, and TDV 518, until signal TEST IN emerges from TDV 518. Optional logic function block 552 may then perform signal analysis on the emergent signal from TDV 518 to determine the status of the test.

Once a first portion of the interconnect structure between base die 504 and stacked die 506 is verified, logic function block 550 may direct signal TEST IN, as received from input pad 538, to pads 542, 530, and TDV 512 to test their continuity. Similarly, logic function block 550 may direct signal TEST IN, as received from input pad 538, to pads 544, 532, and TDV 514 to test their continuity. Logic function block 550 may also perform Boolean operations on signal TEST IN, so as to test the interconnect structure between base die 504 and stacked die 506 for "stuck at" faults, such as "stuck at logic high", "stuck at logic low", or high impedance failure modes.

Optional logic function block 552 may also be configured within base die 504, so as to interoperate with logic function block 550 during enhanced testing of the interconnect structure between base die 504 and stacked die 506. In particular, a sequence of logic values may be transmitted by logic function block 552 via signal TEST IN to logic function block 550 via any one or all of TDVs 508-514 as required. Conversely, logic function block 552 may bypass logic function block 550 to initiate a loop-back to test the continuity of a portion of the interconnect involving, e.g., TDVs 516, 518 and pads 516-518 and 546-548. In such an instance, bit error rate (BER) testing may be facilitated using at-speed logic transitions over extended periods of time to determine the high-bandwidth performance of a portion of the interconnect structure between base die 504 and stacked die 506. The BIT circuits and programmable multiplexers, therefore, form mechanisms within the stacked-die package to substantially confirm complete conductivity between the base die and the stacked die despite the inter-connectivity mismatch.

It is noted that the input pads and output pads of FIGS. 2A-5 may accommodate multiple signal paths that are not explicitly illustrated. It is understood, however, that other signal paths may be active during normal operating conditions that involve the I/O pads of FIGS. 2A-5. Thus, only the exemplary circuits utilized to perform testing of the inter-die connections between the base die and the one or more stacked die are shown for brevity.

Figure 6:
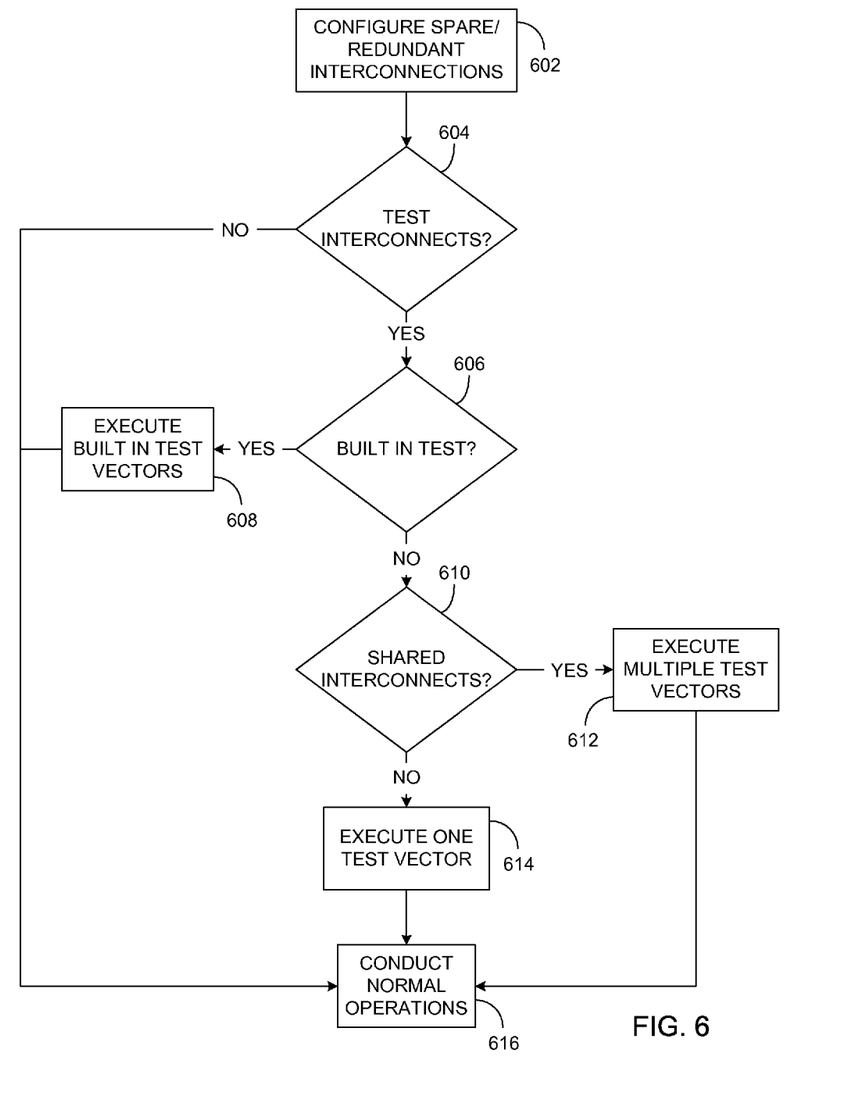
FIG. 6 illustrates a flow diagram of alternative test methodologies for testing of inter-die interfaces in die stacking applications, in accordance with an embodiment of the present invention.

Turning to FIG. 6, a flow diagram is exemplified, in which alternative test methodologies are illustrated to test inter-die interfaces in die stacking applications. In step 602, redundant and/or spare interconnections may be optionally formed within the base die or the one or more stacked die to accommodate any potential inter-die mismatches that may exist within a given stacked die application. In a first embodiment, a number of through-die vias (TDVs), or redundant TDVs, are implemented using flexible design rules, as discussed above in relation to FIG. 2B, whereby flexible design rules such as increased TDV diameter and TDV spacing are utilized, for example, to increase TDV yield. Since flexible design rules are used to implement the redundant TDVs, a presumption exists that the redundant TDV yield is high enough to obviate the need to test the spare TDVs as determined in step 604. The redundant TDVs and associated interconnect pads may then be utilized during normal operations as required in step 616.

In alternate embodiments, redundant TDVs may instead be optionally implemented in step 602 using standard design rules, as discussed above in relation to FIG. 2A, whereby the number of redundant TDVs implemented is increased. In such an instance, the statistical yield is increased due to the redundancy established by the increased number of TDVs. A presumption exists, therefore, that the redundant TDV yield is high enough such that testing of the redundant TDVs may be precluded as determined in step 604. The redundant TDVs and associated interconnect pads may then be utilized during normal operations as required in step 616.

In alternate embodiments, one or more logic function blocks may be configured to perform logic operations, as discussed above in relation to FIG. 5, using a plurality of inter-die input/output (I/O) signals to accommodate a mismatch between the number of input and output ports that exist between the base die and the one or more stacked die for scan-chain testing. For example, the need for built-in-test vectors may be determined in step 606 and executed in step 608 by logic function blocks 550 and/or 552 to determine the existence of "stuck" logic values between each interconnect, or to determine the bandwidth performance of each interconnect using BER testing. It is understood that a plurality of test methodologies may be implemented by logic function blocks 550 and/or 552 as may be required by the particular stacked die application.

In alternate embodiments, one or more programmable multiplexers may be utilized to share one or more inter-die connections between the base die and the one or more stacked die, the presence of which is determined in step 610, as discussed above in relation to FIG. 3. In such an instance, two or more test vectors may be submitted to the stacked-die package, as in step 612, so as to exercise all of the signal paths of the interconnect between the base die and the one or more stacked die using the programmable multiplexers of, e.g., the programmable heterogeneous integration (PHI) tile, that may be used to facilitate the interconnections.

In alternate embodiments, spare TDVs may instead be utilized only for test purposes in order to obviate the need to share inter-die interconnects for test purposes. In such an instance, as discussed above in relation to FIG. 4, only a single test vector is required in step 614 to activate the spare TDVs during test operations so as to perform scan-chain testing on each inter-die interconnect. Once testing of the inter-die connections is complete, the inter-die interconnections may be re-programmed for normal operations as in step 616.

Other aspects and embodiments of the present invention will be apparent to those skilled in the art from consideration of the specification and practice of the invention disclosed herein. For example, while TDVs are illustrated as forming a portion of the inter-die signal paths to be verified, it is understood that intra-layer and inter-layer signal traces, for example, within each of the base and stacked die may also be verified in addition to, or instead of, the TDVs discussed herein. It is intended that the specification and illustrated embodiments be considered as examples only, with a true scope and spirit of the invention being indicated by the following claims.

What is claimed is:

1. A stacked-die package, comprising:
a base die having first and second pluralities of through-die vias coupled to a first plurality of input and output pads on a first surface of the base die;
a first stacked die having a second plurality of input and output pads on a first surface of the first stacked die, where the first plurality of input and output pads is coupled to the second plurality of input and output pads and a portion of the first plurality of input and output pads is adapted to transfer signals between the base die and the first stacked die by the first plurality of through-die vias and a second portion of the second plurality of input and output pads during testing and normal operation of the stacked-die package; and
a scan chain loop enabling a transfer of test signals between the base die and the first stacked die by the first plurality of through-die vias and the second portion of the second plurality of input and output pads during testing;
wherein the first plurality of through-die vias are implemented according to first design rules and the second plurality of through-die vias are implemented according to second design rules to enable confirming conductivity between the base die and the first stacked die despite a mismatch between a number of the portion of the first plurality of input and output pads and a number of the first plurality of input and output pads or a number of the portion of the second plurality of input and output pads and a number of the second plurality of input and output pads; and
wherein the second plurality of through-die vias are not connected to the scan chain loop during testing.

2. The stacked-die package of claim 1, wherein implementing the first plurality of through-die vias according to first design rules and the second plurality of through-die vias according to second design rules obviates a need to test the second plurality of through-die vias.

3. The stacked-die package of claim 2, wherein the second plurality of through-die vias have a larger diameter relative to a diameter of the first plurality of through-die vias.

4. The stacked-die package of claim 3, wherein the second plurality of through-die vias have increased spacing between each of the second plurality of through-die vias relative to a spacing between each of the first plurality of through-die vias.

5. The stacked-die package of claim 1, wherein the first and second pluralities of through-die vias comprise the implementation of redundant through-die vias which are included within the second plurality of through-die vias and adapted to transfer test signals between the base die and the first stacked die during a test mode of operation.

6. The stacked-die package of claim 1, further comprising a first plurality of programmable multiplexers which are coupled to the first plurality of through-die vias and enable a transfer of test signals between the base die and the first stacked die during a test mode of operation.

7. The stacked-die package of claim 6, further comprising a second plurality of programmable multiplexers coupled to the second plurality of input and output pads.

8. The stacked-die package of claim 7, wherein the first and second pluralities of multiplexers are adapted to propagate a test signal throughout the first plurality of through-die vias and the portion of the first plurality of input and output pads and the second portion of the second plurality of input and output pads during the test mode of operation.

9. The stacked-die package of claim 8, further comprising:
a third plurality of input and output pads on a second surface of the first stacked die;
a third plurality of through-die vias coupled to the second and third pluralities of input and output pads; and
a third plurality of programmable multiplexers coupled to a portion of the third plurality of through-die vias and the third plurality of input and output pads.

10. The stacked-die package of claim 9, further comprising a second stacked die having a fourth plurality of input and output pads coupled to the third plurality of through-die vias, wherein the first, second, and third pluralities of multiplexers are adapted to propagate a test signal throughout the first, second, and third pluralities of through-die vias and the first plurality of input and output pads, the second portion of the second plurality of input and output pads, and the third and fourth pluralities of input and output pads during the test mode of operation.

11. A method of substantially confirming the conductivity of a mismatched inter-die interface of a stacked-die package, the method comprising:
configuring first and second pluralities of through-die vias within a base die;
coupling the first and second pluralities of through-die vias to a corresponding first plurality of input and output pads within the base die;
coupling a second plurality of input and output pads within a stacked die to the first plurality of input and output pads within the base die, wherein a first portion of the first plurality of input and output pads coupled to a second portion of the second plurality of input and output pads are adapted to transfer signals between the base die and the first stacked die during testing and normal operation of the stacked-die package, and the first plurality of through-die vias are implemented according to first design rules and the second plurality of through-die vias are implemented according to second design rules;
configuring a scan chain loop that enables a transfer of test signals between the base die and the first stacked die by the first plurality of through-die vias and a second portion of the second plurality of input and output pads during testing; and confirming conductivity between the base die and the stacked die using the first and second pluralities of through-die vias despite a mismatch in a number of the first portion of the first plurality of input and output pads and a number of the first plurality of input and output pads or a number of the first portion of the second plurality of input and output pads and a number of the second plurality of input and output pads;

wherein the second plurality of through-die vias are not connected to the scan chain loop during testing.

12. The method of claim 11, wherein confirming conductivity between the base die and the stacked die comprises:

coupling a first plurality of programmable multiplexers to the first plurality of through-die vias; and coupling a second plurality of programmable multiplexers to the second plurality of input and output pads;

wherein the first plurality of programmable multiplexers and the second plurality of programmable multiplexers enable a transfer of test signals between the base die and the stacked die during a test mode of operation.

13. The method of claim 12, further comprising:

activating a first input of the first and second plurality of programmable multiplexers;

exchanging a test signal through the first plurality of through-die vias and the first inputs of the first and second pluralities of programmable multiplexers to confirm conductivity of a first portion of the inter-die interface;

activating a second input of the first and second plurality of programmable multiplexers; and exchanging a test signal through the second inputs of the first and second pluralities of programmable multiplexers to confirm continuity of a second portion of the inter-die interface.

14. The method of claim 11, wherein confirming a conductivity between the base die and the stacked die comprises coupling a first logic block to the second plurality of input and output pads.

15. The method of claim 14, further comprising:

coupling a second logic block to the first plurality of input and output pads; and exchanging test signals between the first and second logic blocks to confirm the conductivity of the inter-die interface.

* * * * *